(12) United States Patent
Dina

(10) Patent No.: US 11,171,477 B2
(45) Date of Patent: Nov. 9, 2021

(54) TURN OFF CIRCUIT FOR PROTECTION SWITCH

(71) Applicant: Texas Instruments Incorporated, Dallas, TX (US)

(72) Inventor: Marius Vicentiu Dina, Inver Grove Heights, MN (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 81 days.

(21) Appl. No.: 16/794,510

(22) Filed: Feb. 19, 2020

(65) Prior Publication Data
US 2020/0274348 A1    Aug. 27, 2020

Related U.S. Application Data

(60) Provisional application No. 62/809,063, filed on Feb. 22, 2019.

(51) Int. Cl.
*H02H 3/20* (2006.01)
*H02H 1/00* (2006.01)

(52) U.S. Cl.
CPC ............ *H02H 3/20* (2013.01); *H02H 1/0007* (2013.01)

(58) Field of Classification Search
CPC ............................... H02H 3/20; H02H 1/0007
USPC ........................................................ 361/91.1
See application file for complete search history.

(56) References Cited

U.S. PATENT DOCUMENTS

| 6,469,482 | B1 * | 10/2002 | Jahanshir | G11C 5/145 |
| | | | | 323/282 |
| 8,379,419 | B2 * | 2/2013 | Yabuzaki | H02M 1/32 |
| | | | | 363/50 |
| 8,520,349 | B2 | 8/2013 | Billingsley et al. | |
| 9,093,837 | B2 | 7/2015 | Sugahara | |
| 2009/0015977 | A1 * | 1/2009 | Patel | G06F 1/30 |
| | | | | 361/92 |
| 2009/0097181 | A1 * | 4/2009 | Tamegai | H02J 7/00308 |
| | | | | 361/91.5 |
| 2010/0188784 | A1 * | 7/2010 | Young | H02M 3/155 |
| | | | | 361/18 |
| 2012/0139606 | A1 | 6/2012 | Dina et al. | |

(Continued)

FOREIGN PATENT DOCUMENTS

JP    2019017210 A    1/2019

OTHER PUBLICATIONS

PCT Search Report for Application No. PCT/US 2020/019481 dated May 28, 2020.

*Primary Examiner* — Dharti H Patel
(74) *Attorney, Agent, or Firm* — Mark Allen Valetti; Charles A. Brill; Frank D. Cimino

(57) ABSTRACT

A switch circuit includes: a power transistor having a source coupled to a supply terminal, a drain coupled to an output terminal, and a gate; a bipolar transistor having a collector coupled to the supply terminal, an emitter coupled to the gate of the power transistor, and a base; a bias circuit to control an emitter current of the bipolar transistor; and a resistor coupled between the supply terminal and the base. A control circuit receives a current at a current input to turn the bipolar transistor on responsive to a control input being in a first state, and ceases receiving the current at the current input to reduce a gate-source voltage of the power transistor responsive to the control input being in a different second state.

21 Claims, 4 Drawing Sheets

(56) References Cited

U.S. PATENT DOCUMENTS

| | | | | |
|---|---|---|---|---|
| 2013/0200847 A1* | 8/2013 | Kurokawa | ............ | H02J 7/0042 |
| | | | | 320/112 |
| 2013/0286525 A1* | 10/2013 | Kanamori | .............. | H02H 9/004 |
| | | | | 361/101 |
| 2014/0146426 A1* | 5/2014 | Murakami | ........ | G02F 1/136204 |
| | | | | 361/56 |

* cited by examiner

TURN OFF CIRCUIT FOR PROTECTION SWITCH

CROSS-REFERENCE TO RELATED APPLICATION

Under 35 U.S.C. § 119, this application claims priority to, and the benefit of, U.S. provisional patent application No. 62/809,063, entitled "LOW POWER, HIGH VOLTAGE PROTECTION SWITCH WITH FAST TURN OFF TIME", and filed on Feb. 22, 2019, the entirety of which is hereby incorporated by reference.

BACKGROUND

Electrical systems are designed for operation when supplied by input power of a certain voltage range. Protection switches are often used to connect a power supply output to a load circuit power input for operation. The protection switch is turned off when the input power supply voltage exceeds a limit in order to protect the load circuit from overvoltage conditions. Because the protection switch conducts the current from the supply to the load during normal operation, the protection switch is sized to accommodate the expected load current and the input voltage. In addition, the protection switches are generally large to provide low switch impedance to mitigate power dissipation in the protection switch, e.g., low drain-source on-state resistance (RDSON) for a field effect transistor (FET). Moreover, fast turn off time is important to protect the load circuitry where the supply voltage rises quickly. However, the protection switch generally has large gate to drain and gate to source capacitance to be quickly discharged in order to turn the protection switch off in a short amount of time.

SUMMARY

According to one aspect, a switch circuit includes a supply terminal, a reference terminal, and a power transistor having a source coupled to a supply terminal, a drain, and a gate. A bipolar transistor has a collector, an emitter and a base. The emitter is coupled to the supply terminal, the emitter is coupled to the gate of the power transistor. The switch circuit further includes a bias circuit coupled to the gate of the power transistor, as well as a resistor coupled between the supply terminal and the base. A control circuit includes a control input, a current input, and a reference input. The current input is coupled to the base of the bipolar transistor, and the reference input is coupled to the reference terminal. The control circuit is configured to receive a current at the current input responsive to the control input having a first state, and to cease receiving the current responsive to the control input having a second state.

In one example, the bias circuit has a current source coupled between the gate of the power transistor and the reference terminal. In one example, the control circuit includes a control transistor having a drain, a source and a gate. The drain is coupled to the base. The control circuit also includes a control current source coupled between the source of the control transistor and the reference terminal. In this example, the control circuit also includes a switching circuit coupled to the gate of the control transistor to turn the control transistor on to receive the current at the current input responsive to the control input having the first state, and to turn the control transistor off to discontinue the current through the resistor responsive to the control input having the second state. In one implementation of this example, the switching circuit includes a first switch having a first terminal coupled to a clamped supply terminal with a clamped supply voltage lower than a first voltage of the supply terminal, and a second terminal coupled to the gate of the control transistor, as well as a second switch having a first terminal coupled to the gate of the control transistor, and a second terminal coupled to the reference terminal.

One example includes a p-channel field effect transistor (PFET) having a source coupled to the supply terminal, a drain coupled to the base, and a gate, along with a second resistor coupled between the supply terminal and the gate of the PFET. The control circuit in this example conducts conduct a second current through the second resistor responsive to the control input having the second state, and discontinues the second current responsive to the control input having the first state.

In one example, the control circuit includes a second control transistor having a drain, a source and a gate. The drain is coupled to the gate of the PFET. The control circuit in this example turns the second control transistor on to receive the second current at a second current input from the gate of the PFET responsive to the control input having the second state, and turns the second control transistor off to cease receiving the second current at the second current input responsive to the control input having the first state. In one implementation of this example, the switching circuit includes a first switch having a first terminal coupled to a clamped supply terminal with a clamped supply voltage lower than a first voltage of the supply terminal, and a second terminal coupled to the gate of the control transistor, as well as a second switch having a first terminal coupled to the gate of the control transistor, and a second terminal coupled to the reference terminal.

The switching circuit in this example also includes a third switch having a first terminal coupled to the clamped supply terminal, and a second terminal coupled to the gate of the second control transistor, as well as a fourth switch having a first terminal coupled to the gate of the second control transistor, and a second terminal coupled to the reference terminal. The switching circuit in this implementation turns the first and fourth switches on responsive to the control input having the first state and turns the first and fourth switches off responsive to the control input having the second state. In this example, the switching circuit turns the second and third switches off responsive to the control input having the first state and turns the second and third switches on responsive to the control input having the second state.

In one example, the switch circuit further includes a second PFET having a source coupled to the supply terminal, a drain coupled to the gate of the power transistor, and a gate coupled.

According to another aspect, a circuit is provided to turn off a power transistor coupled between a supply terminal and an output terminal. The circuit includes a bipolar transistor having a collector, an emitter and a base. The collector is configured to be coupled to the supply terminal, and the emitter is configured to be coupled to a control terminal of the power transistor. A bias circuit is coupled between the control terminal of the power transistor and a reference terminal to control an emitter current of the bipolar transistor. A resistor is coupled between the supply terminal and the base. The circuit further includes a control circuit having a control input, a reference input and a current input. The current input is coupled to the base, and the reference input is coupled to the reference terminal. The control circuit is configured to receive a current through the resistor at the current input to turn the bipolar transistor on in response to the control input having a first state, and to cease receiving the current at the current input to reduce a gate-source voltage of the power transistor in response to the control input having a different second state.

In one example, the control circuit includes a control transistor, a control current source, and a switching circuit. The control transistor has a drain coupled to the base, a source, and a gate, and the control current source is coupled between the source of the control transistor and the reference terminal. The switching circuit is configured to turn the control transistor on to receive the current from the base at the current input responsive to the control input having the first state, and turn the control transistor off to cease receiving the current at the current input responsive to the control input having the second state.

The circuit in one example includes a PFET and a second resistor. The PFET has a source configured to be coupled to the supply terminal, a drain coupled to the base, and a gate, and the second resistor has a first terminal configured to be coupled to the supply terminal, and a second terminal coupled to the gate of the PFET at a second current input of the control circuit. The control circuit in this example is configured to receive a second current at the second current input to turn the PFET on responsive to the control input having the second state, and to cease receiving the second current at the second current input to turn the PFET off responsive to the control input having the first state.

In one example, the circuit also includes a second PFET having a source coupled to the supply terminal, a drain coupled to the control terminal of the power transistor, and a gate coupled to the gate of the PFET.

In accordance with another aspect, a protection system includes a clamped supply circuit, a sense circuit, a comparator, and a power transistor. The clamped supply circuit has an input and an output, where the input is coupled to a supply terminal, and the output is configured to provide a clamped supply voltage lower than a voltage of the supply terminal. The sense circuit has an input and an output, there the input is coupled to sense a voltage of the supply terminal. The comparator has a first input, a second input and a comparator output. The first input is coupled to the output of the sense circuit, the second input is coupled to a voltage reference, and the comparator output has a first state responsive to a voltage of the output of the sense circuit being less than a reference voltage of the voltage reference, and a second state responsive to the voltage of the output of the sense circuit being greater than the reference voltage. The power transistor has a source, a drain and a gate. The source is coupled to the supply terminal, and the drain is coupled to an output terminal. The protection system also includes a bipolar transistor, a bias circuit, a resistor, and a control circuit. The bipolar transistor has a collector, an emitter and a base. The collector is coupled to the supply terminal, and the emitter is coupled to the gate of the power transistor. The bias circuit is coupled between the gate of the power transistor and a reference terminal and is configured to control an emitter current of the bipolar transistor. The resistor is coupled between the supply terminal and the base. The control circuit has a control input, a current input and a reference input. The control input is coupled to the comparator output, the current input is coupled to the base, and the reference input is coupled to the reference terminal. The control circuit is configured to receive a current at the control input to turn the bipolar transistor on responsive to the comparator output having the first state, and to cease receiving the current at the current input responsive to the comparator output having the second state.

In one example, the control circuit includes a control transistor, a control current source, and a switching circuit. The control transistor has a drain, a source and a gate, where the drain is coupled to the base, and the control current source is coupled between the source of the control transistor and the reference terminal. The switching circuit in this example turns the control transistor on to receive the current from the base at the current input responsive to the comparator output having the first state, and turns the control transistor off to cease receiving the current through the resistor at the current input responsive to the comparator output having the second state.

The protection system in one example also includes a PFET and a second resistor. The PFET has a source coupled to the supply terminal, a drain coupled to the base, and a gate, and the second resistor is coupled between the supply terminal and the gate of the PFET. The second current input of the control circuit in this example is configured to receive a second current responsive to the comparator output having the second state, and to cease receiving the second current responsive to the comparator output having the first state.

In one example, the protection system further includes a second PFET having a source coupled to the supply terminal, a drain coupled to the gate of the power transistor, and a gate coupled to the gate of the PFET.

DETAILED DESCRIPTION

Figure 1:
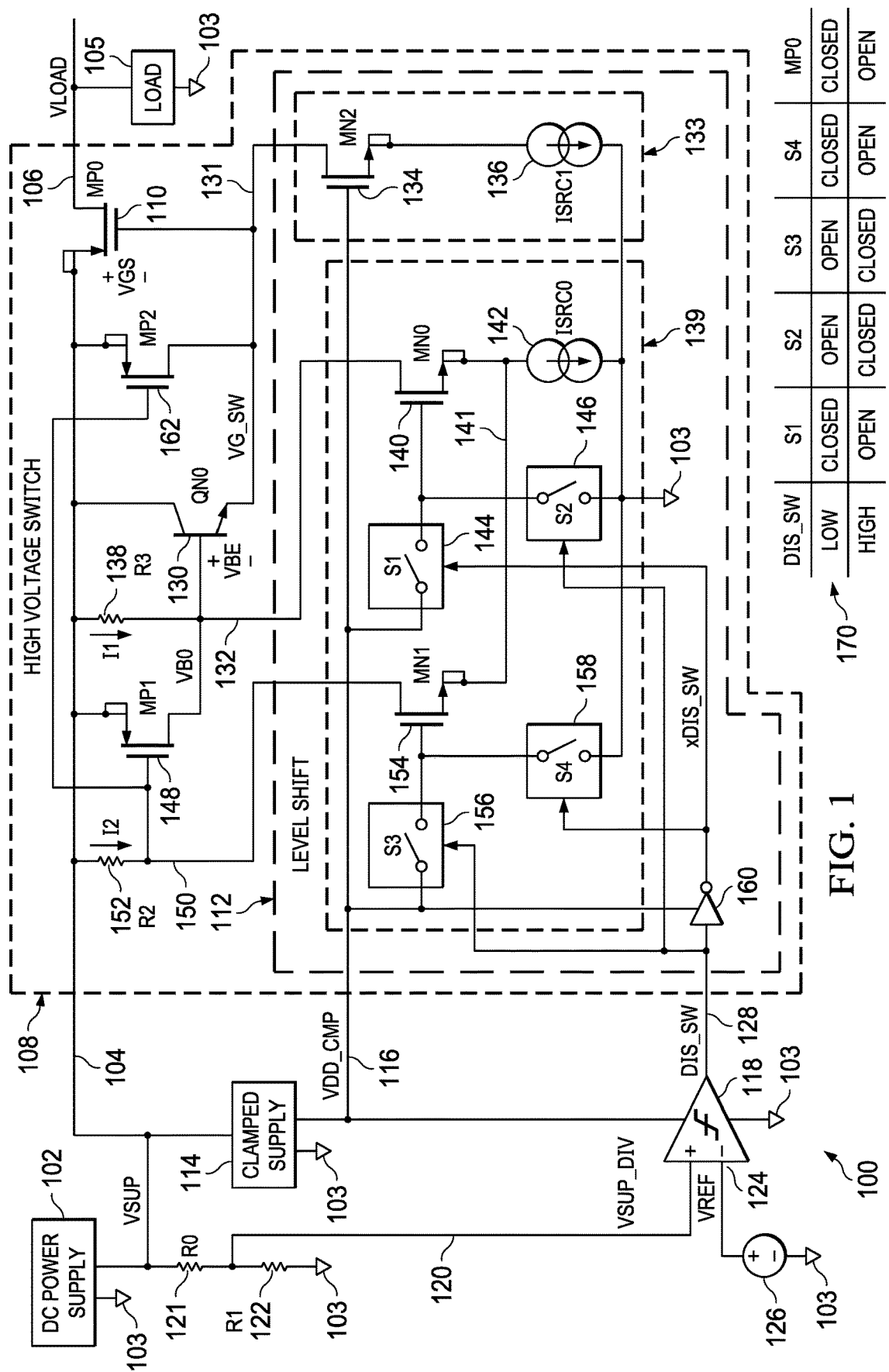
FIG. 1 is a schematic diagram of a protection system having a high voltage protection switch circuit.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a protection system 100 to protect a load. The protection system 100 receives an input supply voltage VSUP from a DC power supply 102 referenced relative to a ground or reference voltage of a reference terminal 103. The DC power supply 102 provides the supply voltage VSUP at supply terminal 104. In one implementation, the supply terminal 104 selectively couples the DC power supply 102 to a load 105 by coupling the supply terminal 104 to an output terminal 106 via a high voltage switch circuit 108 with a power transistor 110 (labeled MP0 in FIG. 1). The switch circuit 108 includes circuitry to turn off the power transistor 110 in response to the supply voltage VSUP reaching or exceeding a limit, in order to protect the circuitry of the load 105 from overvoltage conditions. In order to accommodate high voltage operation, the switch circuit 108 includes a level shift circuit 112 to facilitate low power monitoring of the level of the supply voltage VSUP along with quickly turning the power transistor 110 off. The power transistor 110 in one example is a high-voltage p-channel FET having a source coupled to the supply terminal 104, a drain coupled to an output terminal 106, and a gate. In one example, the power transistor 110 and other transistors of the switch circuit 108 have a body connection coupled to the source terminal as schematically shown in FIG. 1. In operation one the power transistor 110 is turned on, the load 105 has a load voltage VLOAD approximately equal to the supply voltage VSUP minus the source-drain voltage of the power transistor 110.

The level shift circuit 112 is powered by a clamped supply voltage VDD_CMP provided by a clamped supply circuit 114 having an input coupled to a supply terminal 104, and an output to provide a clamped supply voltage VDD_CMP at a clamped supply terminal 116. In one example, the clamped supply voltage VDD_CMP at the clamped supply terminal 116 is lower than the supply voltage VSUP of the supply terminal 104. The protection system 100 also includes a comparator 118 supplied by the clamped supply voltage VDD_CMP. In the illustrated example, the comparator 118 is coupled in a single ended configuration with a positive supply rail coupled to the clamped supply terminal 116, and a second supply rail coupled to the reference terminal 103.

The protection system 100 further includes a sense circuit with a sense circuit output 120 that provides a divided supply voltage signal VSUP_DIV to a first (e.g., non-inverting) input of the comparator 118. The sense circuit includes first and second resistors 121 and 122, respectively, forming a resistive voltage divider circuit. The first resistor 121 (labeled R0) has a first terminal that forms a sense circuit input coupled to the supply terminal 104, and a second terminal coupled to the sense circuit output 120. The second resistor 122 (labeled R1) has a first terminal coupled to the sense circuit output 120, and a second terminal coupled to the reference terminal 103.

A second (e.g., inverting) input 124 of the comparator 118 is coupled to a voltage reference 126 that provides a reference voltage VREF referenced to the voltage of the reference terminal 103. A comparator output 128 provides a control signal DIS_SW to the level shift circuit 112 for selectively disabling the power transistor 110 (e.g., turning the power transistor 110 off to disconnect the load 105 from the supply terminal 104). In operation, the output 128 of the comparator 118 provides the control signal DIS_SW in a first state (e.g., LOW) in response to the divided supply voltage VSUP_DIV being less than the reference voltage VREF of the voltage reference 126. The comparator output 128 provides the control signal DIS_SW in a different second state (e.g., HIGH) in response to the divided supply voltage VSUP_DIV being greater than the reference voltage VREF. In one example, the comparator 118 is a hysteresis comparator to mitigate undesirable toggling between first and second states. In operation, the supply voltage VSUP can exceed many times its nominal operating voltage (e.g., during a fault condition). Accordingly, the comparator 118 is powered by the clamped supply voltage VDD_CMP that is clamped to a maximum value regardless of the supply voltage VSUP. For example, if the nominal supply voltage VSUP is 3.3 V, the clamped supply voltage VDD_CMP in one example is 2.6 V.

However, during a power supply fault condition, if the supply voltage VSUP goes to 15 V, then the clamped supply voltage VDD_CMP in this example would not exceed 3.5 V. In one example, moreover, the supply voltage VSUP is not provided directly to the comparator, so the sense circuit resistive divider 121, 122 scales down the supply voltage VSUP to the divided supply voltage VSUP_DIV, and the ratio of the resistors 121 and 122 is set in this example such that when the supply voltage VSUP reaches a maximum voltage (e.g., 15V under the fault condition), VSUP_DIV will still be within the safe operating voltage range of the comparator input. The level shift circuit 112 operates to shift the output of the comparator control signal DIS_SW to a voltage level suitable to drive the power transistor 110 (e.g., via the signal VG_SW). In one example, the power transistor 110 is a high-voltage drain extended PMOS transistor (DEP-MOS).

The level shift circuit 112 operates according to the current state of a control input coupled to receive the control signal DIS_SW from the comparator output 128, in order to allow the power transistor 110 to remain on when the control signal DIS_SW is in the first state (LOW), and to selectively turn off the power transistor 110 in response to the control signal control signal DIS_SW being in the second state (HIGH). An initial power up of the DC power supply 102, the rising supply voltage VSUP at the source of the power transistor 110 provides a gate-source voltage VGS with the gate voltage of the power transistor 110 being lower than the rising source voltage, by which the power transistor 110 turns on to couple the supply terminal 104 with the output terminal 106. The clamped supply circuit 114 provides the clamped supply voltage VDD_CMP to the level shift circuit 112 and to the comparator 118, and the system begins monitoring the level of the supply voltage VSUP by comparing the divided supply voltage VSUP_DIV to the reference voltage VREF. The reference voltage VREF and the relative values of the sense circuit resistors 121 and 122 in one example are designed to establish a threshold for the supply voltage VSUP, below which the power transistor 110 is allowed to remain on, and above which the level shift circuit 112 will initiate fast turn off of the power transistor 110 as described further below.

The switch circuit 108 includes a bipolar transistor 130 (labeled QN0) that is coupled to the level shift circuit 112 to quickly discharge the gate-source capacitance of the power transistor 110 to quickly turn the power transistor 110 off in response to the control signal DIS_SW being in the second state. The bipolar transistor 130 has a collector, an emitter and a base. The collector is coupled to the supply terminal 104, the emitter is coupled to the gate of the power transistor 110 at a first node 131, and the base is coupled to a second node 132. When the bipolar transistor 130 turns on, a voltage across the gate-source capacitance of the power transistor 110 is just charged through current path formed from the collector to the emitter of the bipolar transistor 130. The level shift circuit 112 includes a bias circuit 133 coupled between the first node 131 (the gate of the power transistor (110) and the reference terminal 103. The bias circuit 133 is configured to control the emitter current of the bipolar transistor 130 to facilitate quickly discharging the source-gate capacitance of the power transistor 110.

The bias circuit 133 has an n-channel field effect transistor 134 (NFET, labeled MN0) coupled in series with a first current source 136 between the first node 131 and the reference terminal 103. The transistor 134 includes a drain, a source and a gate. The drain is coupled to the first node 131, the source is coupled to the first current source 136, and the gate is coupled to the clamped supply terminal 116. The first current source 136 is coupled between the source of the transistor 134 and the reference terminal 103. The transistor 134 turns on in response to establishment of the clamped supply voltage VDD_CMP, and allows the bias circuit 133 to receive a current ISRC1 from the first node 131 to bias the bipolar transistor 130. The bipolar transistor 130 operates as an emitter-follower in which the power transistor gate voltage VG_SW at the first node 131 follows a base voltage VB0 of the transistor base, and the gate voltage VG_SW is VB0 minus the base emitter voltage VBE of the bipolar transistor 130.

The switch circuit 108 also includes a resistor 138 with a first terminal and a second terminal (labeled R3 in FIG. 1). The first terminal is coupled to the supply terminal 104, and the second terminal is coupled to the base at the second node 132. The level shift circuit 112 includes a control circuit 139 coupled to the comparator output 128, the reference terminal 103 and to the base at the second node 132. The control circuit 139 includes a control input, a current input, and a reference input. The control input is coupled to the comparator output 128 to receive the control signal DIS_SW. The control input has a first state when the control signal DIS_SW is in the first state, and the control input has a different second state when the control signal DIS_SW is in its second state. The control circuit 139 has a current input coupled to the base of the bipolar transistor 130 at the first node 131. The control circuit 139 has a reference input coupled to the reference terminal 103. In one example, the control circuit 139 also has a second current input. In operation, the control circuit 139 receives a current I1 through the resistor 138 at the current input at the node 132 to turn the bipolar transistor 130 on in response to the control input having the first state (e.g., in response to the control signal DIS_SW being in the first state). The control circuit ceases receiving the current I1 through the resistor 138 at the current input in response to the control input having the second state (e.g., in response to the control signal DIS_SW being in the second state). The control circuit 139 includes a control transistor 140 (labelled MN0), a control current source 142, and a switching circuit with a first switch 144 (labelled S1) and a second switch (labeled S2). The first switch 144 has a first terminal coupled to the clamped supply terminal 116, and a second terminal coupled to the gate of the control transistor 140. The second switch 146 has a first terminal coupled to the gate of the control transistor 140, and a second terminal coupled to the reference terminal 103.

The control transistor 140 in one example is an NFET with a drain coupled to the base at the second node 132, a source coupled to a third node 141, and a gate. The control current source 142 is coupled between the third node 141 and the reference terminal 103. In operation, the switching circuit turns the first switch 144 on and turns the second switch 146 off in response to the control signal DIS_SW being in the first state. This couples the gate of the control transistor 140 to the clamped supply terminal 116, and turns the control transistor 140 on. In this condition, the control current source 142 receives a current ISRC0 from the base at the second node to cause the current I1 two flow through the resistor 138. At least a portion of the current received at the current input is supplied from the supply terminal 104 through the resistor 138. The bipolar transistor 130 is configured to turn on responsive to the control circuit 139 receiving the current at the current input, and the gate-to-source voltage VGS of the power transistor 110 decreases responsive to the control circuit 139 ceasing to receive the current at the current input. The current I1 establishes a voltage across the resistor 138 (R3) that lowers the base voltage VB0 of the bipolar transistor 130, and thereby also lowers the gate voltage VG_SW of the power transistor 110 at the first node 131. The current source 142 and the resistance of the resistor 138 are designed in one example such that the established base voltage VB0 and the resulting gate voltage VG_SW maintain the power transistor 110 on when the control signal DIS_SW is in the first state.

The switching circuit turns the control transistor 140 off to cease receiving the current I1 at the current input responsive to the control input having the second state (e.g., responsive to the control signal DIS_SW being in the second state). In the illustrated example, the control circuit 139 responds to a change in the control signal DIS_SW to the second state by turning the first switch 144 off and turning the second switch 146 on, causing the control transistor 140 to turn off and cease receiving the current I1 at the current input. As a result, the voltage across the resistor 138 drops and the base voltage VB0 rises toward the supply voltage VSUP. The emitter-follower configuration of the bipolar transistor 130 in this state causes the gate voltage VG_SW at the first node to rise accordingly, and helps to turn the power transistor 110 off in response to the control signal DIS_SW being in the first state.

In one example, the switch circuit 108 further includes a PFET 148 (labeled MP1) and a second resistor 152. The PFET 148 has a source coupled to the supply terminal 104, a drain coupled to the base at the second node 132, and a gate coupled to a fourth node 150. The second resistor 152 (labeled R2) has a first terminal coupled to the supply terminal 104, and a second terminal coupled to the gate of the PFET at the fourth node 150. The control circuit 139 in this example includes a second control transistor 154 (e.g., an n-channel FET or NFET labeled MN1) having a drain coupled to a second current input of the control circuit coupled to the fourth node 150. The second control transistor 154 also includes a source coupled to a third node 141, and a gate. In addition, the switching circuit includes a third switch 156 (labeled S3) having a first terminal coupled to the clamped supply terminal 116, and a second terminal coupled to the gate of the second control transistor 154, as well as a fourth switch 158 (labeled S4) having a first terminal coupled to the gate of the second control transistor 154, and a second terminal coupled to the reference terminal 103.

In response to the control input having the second state (e.g., in response to the control signal DIS_SW being in the second state), the switching circuit turns the third switch 156 on and turns the fourth switch 158 off to turn the second control transistor 154 on. In this condition, the second control transistor 154 receives a current at the second current input equal to the current ISRC0 from the control current source 142, from the second current input at the fourth node 150, to cause a second current I2 to flow through the second resistor 152. The second current I2 creates a voltage across the second resistor 152, and provides a non-zero gate source voltage between the source and gate of the PFET 148 that turns the PFET 148 on. When the PFET 148 turns on, this helps to quickly raise the base voltage VB0 at the second node 132 to or toward the supply voltage VSUP, and the emitter-follower connection of the bipolar transistor 130 raises the gate voltage VG_SW at the first node 131 closer to the supply voltage VSUP to help quickly turn the power transistor 110 off. In response to the control input having the first state (e.g., in response to the control signal DIS_SW being in the being in the first state), the switching circuit turns the third switch 156 off and turns the fourth switch 158 on to turn the second control transistor 154 off. In this condition, the control circuit 139 ceases receiving the second current I2 through the second resistor 152 at the second current input to turn the PFET 148 off.

The respective second and third switches 146 and 156 in this example include control inputs coupled to the comparator output 128 to operate according to the control signal DIS_SW received at the control input of the control circuit 139. The switching circuit in FIG. 1 includes an inverter 160 with an input coupled to the comparator output 128 to receive the control signal DIS_SW, and an output coupled to provide an inverted control signal xDIS_SW to control inputs of the respective first and fourth switches 144 and 158. FIG. 1 includes a table 170 that shows the states of the switches 144 (S1), 146 (S2), 156 (S3), and 158 (S4), as well as the power transistor 110 (MP0) as a function of the state (e.g., LOW or HIGH) of the control signal DIS_SW to further illustrate operation of the switching circuit.

In one example, the switch circuit 108 further includes a second PFET 162 (labeled MP2). The second PFET 162 has a source coupled to the supply terminal 104, a drain coupled to the first node 131, and a gate coupled to the fourth node 150. When the switching circuit turns the second control transistor 154 on in response to the control signal DIS_SW being in the second state, the voltage at the fourth node 150 is less than the second PFET 162 on. This creates a low impedance path between the source and gate of the power transistor 110 to further facilitate fastest charging of the source-gate capacitance of the power transistor 110.

Figure 2:
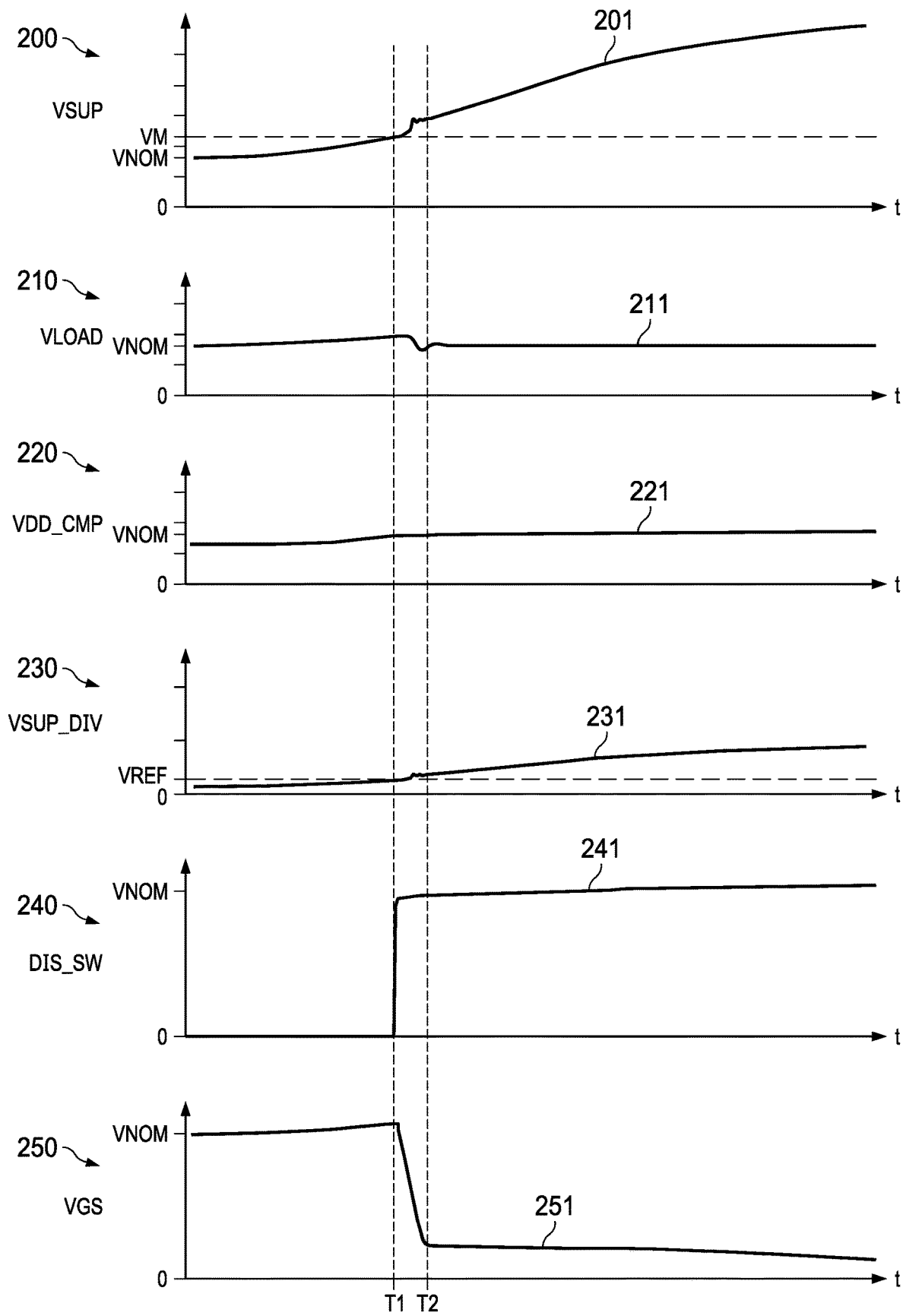
FIG. 2 is a diagram of signals in the high voltage protection switch circuit of FIG. 1.
Figure 3:
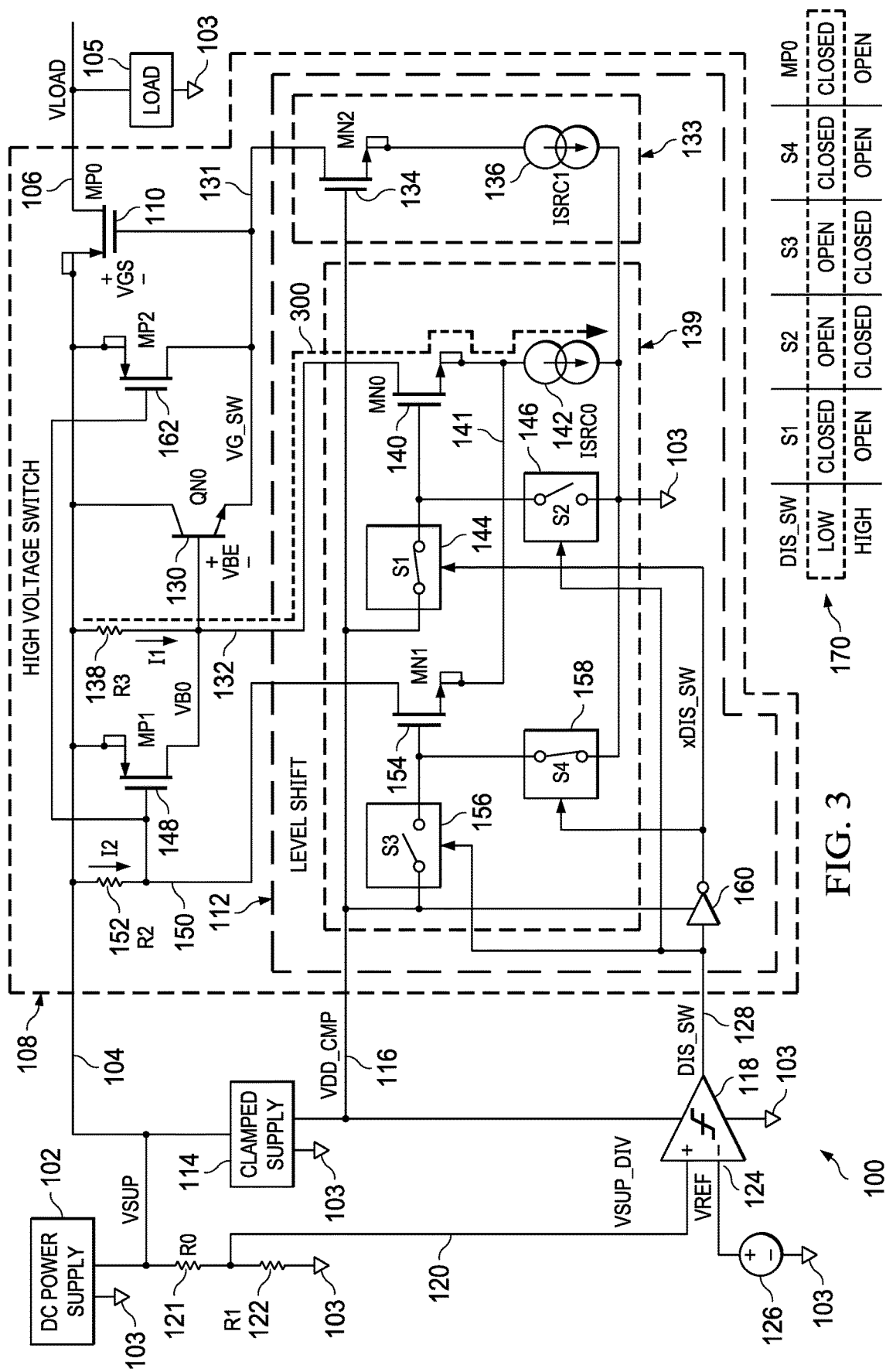
FIG. 3 is a schematic diagram of an example of the high voltage protection switch circuit of FIG. 1 in a first state.
Figure 4:
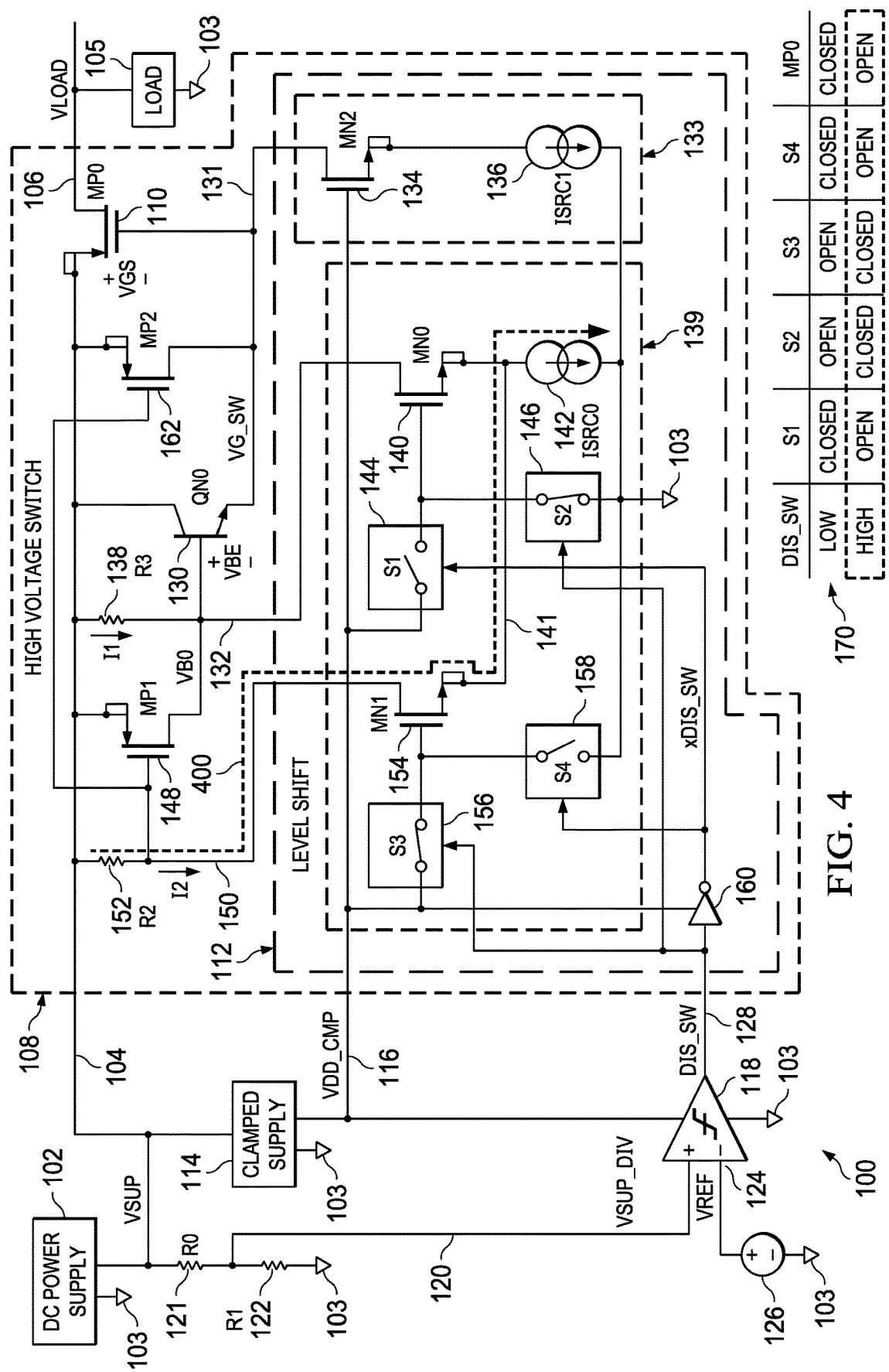
FIG. 4 is a schematic diagram of an example of the high voltage protection switch circuit of FIG. 1 in a second state.

Referring also to FIGS. 2-4, FIG. 2 shows signals during operation of an example of the high voltage protection switch circuit 108 of FIG. 1, FIG. 3 shows an example of the high voltage protection switch circuit of FIG. 1 with the control input having the first state (e.g., the control signal DIS_SW in the first state), and FIG. 4 shows an example of the switch circuit 108 with the control input having the second state (e.g., the control signal DIS_SW in the second state). FIG. 2 shows a graph 200 with an example curve 201 showing the supply voltage VSUP as a function of time in operation of the system 100, as well as a graph 200 with a curve 211 that shows the load voltage VLOAD at the output terminal 106, and a graph 220 with a curve 221 that shows the clamped supply voltage VDD_CMP. The graphs 200, 210 and 220 include indications of a nominal supply voltage level labeled VNOM. In the illustrated example, the supply voltage VSUP increases past a threshold determined by the resistive divider sense circuit 121, 122 and the reference voltage VREF at time T1, as shown in a graph 230 with a curve 231 that shows the divided supply voltage VSUP_DIV and the corresponding reference voltage VREF. FIG. 2 also shows a graph 240 with a curve 241 that represents the control signal DIS_SW provided by the comparator output 128, as well as a graph 250 with a curve 251 showing the gate-source voltage VGS of the power transistor 110.

In operation with the supply voltage VSUP within a normal operating range prior to T1 in FIG. 2, and as shown in the circuit diagram of FIG. 3, the control signal DIS_SW is in the first state and the control input of the control circuit 139 has the first state. The switching circuit turns on the first control transistor 140 to allow the current ISRC0 from the control current source 142 to pass through the resistor 138 two the first control transistor 140 along a current path 300 in FIG. 3. This creates a voltage drop equal to ISRC0*R3 across the resistor 138. Also, in this state, the first current source 136 provides a bias current ISRC1 to the bipolar transistor 130, which is configured as an emitter-follower. As a result, the gate of the power transistor 110 at the first node 131 is driven to a voltage bellow the supply voltage VSUP that is equal to VSUP−(ISRC0*R3+ VBE). The values of ISRC0 and R3 are designed in one example, such that a maximum gate-source voltage VGS of the power transistor 110 is not exceeded.

When the supply voltage VSUP goes above the normal operating range at T1 (e.g., meets or exceeds a maximum voltage VM indicated in the graph 210), the control signal DIS_SW at the comparator output 128 transitions to the second state (e.g., HIGH), and the control input of the control circuit 139 has the second state, as shown in the schematic circuit diagram of FIG. 4. In response, the switching circuit diverts the current ISRC0 of the control current source 142 along a second current path 400 in FIG. 4 via the second control transistor 154 from the second resistor 152 through the second control transistor 154. This current flow I2 creates a voltage drop equal to ISRC0*R2, which quickly turns the transistor 148 on. This pulls the base voltage VB0 of the bipolar transistor 130 at the second node 132 up near the supply voltage VSUP (along with the emitter terminal at the first node 131), thereby pulling the gate of the power transistor 110 very quickly towards the supply voltage VSUP. In this case, the bipolar transistor 130 by itself only pulls the voltage of the first node 131 (VG_SW) to VSUP−VBE, which is near the threshold voltage of the power transistor 110. In operation, this may only partially turn the power transistor 110 off, and the power transistor 110 may have a drain-source impedance in the 100K Ohm range or more when VGS of MP0 equals the VBE of QN0. The addition of the transistor 162 in certain embodiments, while providing a relatively weak pull-up, is turned on by the reduced voltage at the fourth node 150, and the transistor 162 finalizes the pullup of the gate voltage VG_SW at the first node 131 to the same voltage as the supply voltage VSUP, which turns the power transistor 110 completely off at time T2 in FIG. 2 after a short turn off time T2-T1.

The disclosed examples provide a low power, fast shut off solution for protecting the load 105 against overvoltage conditions during all conditions of the DC power supply 102. In the illustrated implementations, the only DC currents in the control circuit 139 and the bias circuit 133 are the currents ISRC0 and ISRC1 of the respective current sources 142 and 136. In practice, these currents can be scaled depending on the desired turn off speed of the power transistor 110. In addition, the circuitry of the high voltage switch circuit 108, and the level shift circuit 112 operate from the low voltage clamped supply voltage VDD_CMP, without any separate high side supply. The disclosed solutions thus provide power efficiency advantages over other implementations that use a separate negative supply referenced to the supply voltage VSUP to build up drive for turning the power transistor 110 on-and-off. The disclosed solutions, moreover, allow scaling of the power transistor 110 for any desired current carrying capability, and any desired operating voltage, with the described shut off circuitry providing expedited transition to turn the power transistor 110 off in response to detection of potential over voltage conditions of the DC power supply 102 before the load 105 is exposed to undesired high voltages.

Modifications are possible in the described examples, and other implementations are possible, within the scope of the claims.

What is claimed is:
1. A switch circuit, comprising:
a supply terminal;
a reference terminal;
a power transistor having a source, a drain, and a gate, the source coupled to the supply terminal;

a bipolar transistor having a collector, and emitter, and a base, the collector coupled to the source of the power transistor, and the emitter coupled to the gate of the power transistor;
a bias circuit coupled to the gate of the power transistor;
a resistor having a first terminal and a second terminal, the first terminal coupled to the source of the power transistor, and the second terminal coupled to the base; and
a control circuit having a control input, a current input and a reference input, the current input coupled to the base, the reference input coupled to the reference terminal, the control circuit configured to receive a current at the current input responsive to the control input having a first state, and to cease receiving the current at the current input responsive to the control input having a second state, in which at least a portion of the received current is supplied from the supply terminal through the resistor, the bipolar transistor is configured to turn on responsive to the control circuit receiving the current at the current input, and a gate-to-source voltage of the power transistor decreases responsive to the control circuit ceasing to receive the current at the current input.

2. The switch circuit of claim 1, wherein the bias circuit comprises a current source coupled between the gate of the power transistor and the reference terminal.

3. The switch circuit of claim 1, wherein the control circuit comprises:
a control transistor having a drain, a source, and a gate, the drain of the control transistor coupled to the base;
a control current source coupled between the source of the control transistor and the reference terminal; and
a switching circuit coupled to the gate of the control transistor, the switching circuit configured to: turn the control transistor on to receive the current at the current input responsive to the control input having the first state; and turn the control transistor off to cease receiving the current at the current input responsive to the control input having the second state.

4. The switch circuit of claim 3, further comprising:
a PFET having a source, a drain, and a gate; and
a second resistor having a first terminal coupled to the source of the PFET, and a second terminal coupled to the gate of the PFET;
wherein the control circuit includes a second current input coupled to the gate of the PFET, the control circuit configured to receive a second current at the second current input to turn the PFET on responsive to the control input having the second state, and to cease receiving the second current at the second current input to turn the PFET off responsive to the control input having the first state.

5. The switch circuit of claim 4, wherein:
the control circuit comprises a second control transistor having a drain, a source and a gate, the drain of the second control transistor coupled to the gate of the PFET, the source of the second control transistor coupled to the source of the control transistor; and
the switching circuit is coupled to the gate of the second control transistor and is configured to: turn the second control transistor on to receive the second current at the second current input responsive to the control input having the second state; and turn the second control transistor off to cease receiving the second current at the second current input responsive to the control input having the first state.

6. The switch circuit of claim 5, wherein the switching circuit comprises:
a first switch having a first terminal and a second terminal, the first terminal coupled to a clamped supply terminal with a clamped supply voltage lower than a first voltage of the supply terminal, and the second terminal coupled to the gate of the control transistor;
a second switch having a first terminal and a second terminal, the first terminal coupled to the gate of the control transistor, and the second terminal coupled to the reference terminal;
a third switch having a first terminal and a second terminal, the first terminal coupled to the clamped supply terminal, and the second terminal coupled to the gate of the second control transistor; and
a fourth switch having a first terminal and a second terminal, the first terminal coupled to the gate of the second control transistor, and the second terminal coupled to the reference terminal.

7. The switch circuit of claim 6, wherein:
the switching circuit comprises an inverter having an input and an output, the input coupled to the control input of the control circuit, and the output coupled to control inputs of the first and fourth switches to turn the first and fourth switches on responsive to the control input having the first state and to turn the first and fourth switches off responsive to the control input having the second state; and
control inputs of the second and third switches are coupled to the comparator output to turn the second and third switches off responsive to the control input having the first state and to turn the second and third switches on responsive to the control input having the second state.

8. The switch circuit of claim 5, further comprising a second PFET having a source, a drain and a gate, the source coupled to the supply terminal, the drain coupled to the gate of the power transistor, and the gate coupled to the gate of the PFET.

9. The switch circuit of claim 5, wherein the switching circuit comprises:
a first switch having a first terminal and a second terminal, the first terminal coupled to a clamped supply terminal with a clamped supply voltage lower than a first voltage of the supply terminal, and the second terminal coupled to the gate of the control transistor; and
a second switch having a first terminal and a second terminal, the first terminal coupled to the gate of the control transistor, and the second terminal coupled to the reference terminal.

10. The switch circuit of claim 9, wherein:
the switching circuit comprises an inverter having an input and an output, the input coupled to the control input of the control circuit, and the output coupled to control inputs of the first switch to turn the first switch on responsive to the control input having the first state and to turn the first switch off responsive to the control input having the second state; and
a control input of the second switch is coupled to the comparator output to turn the second switch off responsive to the control input having the first state and to turn the second switch on responsive to the control input having the second state.

11. The switch circuit of claim 4, further comprising a second PFET having a source, a drain and a gate, the source coupled to the supply terminal, the drain coupled to the gate of the power transistor, and the gate coupled to the gate of the PFET.

12. The switch circuit of claim 1, further comprising:
a PFET having a source, a drain and a gate, the source coupled to the supply terminal, and the drain coupled to the base; and
a second resistor having a first terminal and a second terminal, the first terminal coupled to the supply terminal, and the second terminal coupled to the gate of the PFET;
wherein the control circuit includes a second current input coupled to the gate of the PFET, the control circuit configured to receive a second current at the second current input to turn the PFET on responsive to the control input having the second state, and to cease receiving the second current to turn the PFET off responsive to the control input having the first state.

13. The switch circuit of claim 12, further comprising a second PFET having a source, a drain and a gate, the source coupled to the supply terminal, the drain coupled to the gate of the power transistor, and the gate coupled to the gate of the PFET.

14. A circuit, comprising:
a bipolar transistor having a collector, an emitter and a base, the collector adapted to be coupled to a supply terminal, an emitter adapted to be coupled to a control terminal of a power transistor;
a bias circuit adapted to be coupled to the control terminal of the power transistor;
a resistor having a first terminal and a second terminal, the first terminal adapted to be coupled to a supply terminal, and a second terminal coupled to the base; and
a control circuit having a control input, a current input and a reference input, the current input coupled to the base, the reference input adapted to by coupled to a reference terminal, the control circuit configured to receive a current at the current input responsive to the control input having a first state, and to cease receiving the current at the current input responsive to the control input having a second state, in which at least a portion of the received current is supplied from the supply terminal through the resistor, the bipolar transistor is configured to turn on responsive to the control circuit receiving the current at the current input, and a gate-to-source voltage of the power transistor decreases responsive to the control circuit ceasing to receive the current at the current input.

15. The circuit of claim 14, wherein the control circuit comprises:
a control transistor having a drain, a source, and a gate, the drain of the control transistor coupled to the base;
a control current source coupled between the source of the control transistor and the reference terminal; and
a switching circuit coupled to the gate of the control transistor, the switching circuit configured to: turn the control transistor on to receive the current at the current input responsive to the control input having the first state; and turn the control transistor off to cease receiving the current at the current input responsive to the control input having the second state.

16. The circuit of claim 14, further comprising:
a PFET having a source, a drain and a gate, the source coupled to the supply terminal, and the drain coupled to the base; and
a second resistor having a first terminal and a second terminal, the first terminal coupled to the supply terminal, and the second terminal coupled to the gate of the PFET;
wherein the control circuit includes a second current input coupled to the gate of the PFET, the control circuit configured to receive a second current at the second current input to turn the PFET on responsive to the control input having the second state, and to cease receiving the second current to turn the PFET off responsive to the control input having the first state.

17. The circuit of claim 16, further comprising a second PFET having a source, a drain and a gate, the source coupled to the supply terminal, the drain coupled to the control terminal of the power transistor, and the gate coupled to the gate of the PFET.

18. A protection system, comprising:
a clamped supply circuit having an input coupled to a supply terminal, and an output to provide a clamped supply voltage lower than a voltage of the supply terminal;
a sense circuit having an input and an output, the input coupled to the supply terminal;
a comparator having a first input, a second input and a comparator output, the first input coupled to the output of the sense circuit, the second input coupled to a voltage reference, and the comparator output having a first state responsive to a voltage of the output of the sense circuit being less than a reference voltage of the voltage reference, and a second state responsive to the voltage of the output of the sense circuit being greater than the reference voltage;
a power transistor having a source, a drain and a gate, the source coupled to the supply terminal, and the drain coupled to an output terminal;
a bipolar transistor having a collector, an emitter and a base, the collector coupled to the supply terminal, and the emitter coupled to the gate of the power transistor;
a bias circuit coupled between the gate of the power transistor and a reference terminal, the bias circuit configured to control an emitter current of the bipolar transistor;
a resistor having a first terminal coupled to the supply terminal, and a second terminal coupled to the base; and
a control circuit having a control input, a current input and a reference input, the control input coupled to the comparator output, the current input coupled to the base, and the reference input coupled to the reference terminal, the control circuit configured to receive a current at the current input responsive to the comparator output having the first state, and to cease receiving the current at the current input responsive to the comparator output having the second state.

19. The protection system of claim 18, wherein the control circuit comprises:
a control transistor having a drain, a source and a gate, the drain of the control transistor coupled to the base;
a control current source coupled between the source of the control transistor and the reference terminal; and
a switching circuit coupled to the gate of the control transistor to: turn the control transistor on to receive the current at the current input responsive to the comparator output being in the first state; and turn the control transistor off to cease receiving the current at the current input responsive to the comparator output being in the second state.

20. The protection system of claim 18, further comprising:
- a PFET having a source, a drain and a gate, the source coupled to the supply terminal, and the drain coupled to the base; and
- a second resistor having a first terminal and a second terminal, the first terminal coupled to the supply terminal, and the second terminal coupled to the gate of the PFET;
- wherein the control circuit includes a second current input coupled to the gate of the PFET, the control circuit configured to receive a second current at the second current input responsive to the comparator output having the second state, and to cease receiving the second current at the second current input responsive to the comparator output having the first state.

21. The protection system of claim 20, further comprising a second PFET having a source, a drain and a gate, the source coupled to the supply terminal, the drain coupled to the gate of the power transistor, and the gate coupled to the gate of the PFET.

\* \* \* \* \*